United States Patent
Belady et al.

(10) Patent No.: US 6,809,925 B2
(45) Date of Patent: Oct. 26, 2004

(54) DUAL-PURPOSE COMPUTER HAVING GRAVITY-ACTUATED FAN SPEED CONTROL

(75) Inventors: Christian L. Belady, McKinney, TX (US); Christopher G. Malone, Rocklin, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 98 days.

(21) Appl. No.: 10/356,080

(22) Filed: Jan. 31, 2003

(65) Prior Publication Data

US 2004/0150949 A1 Aug. 5, 2004

(51) Int. Cl.[7] .............................................. H05K 7/20
(52) U.S. Cl. ...................... 361/687; 361/683; 361/695; 361/727; 312/351.9; 700/9; 248/615
(58) Field of Search ................................. 361/683, 687, 361/692, 695, 724–727; 248/615, 677, 688, 918, 349.1, 425; 312/351.9, 223.2, 223.3, 326, 257.1, 263, 265.5, 265.6; D14/106, 107; 713/1, 2, 100; 700/9, 45, 170, 282, 304; 364/147, 175, 153, 164, 174, 191, 480, 481; 340/825.06, 825.22; 702/145, 148

(56) References Cited

U.S. PATENT DOCUMENTS

| | | | | |
|---|---|---|---|---|
| 5,450,285 A | * | 9/1995 | Schlemmer | 361/724 |
| 5,749,637 A | * | 5/1998 | McMahan et al. | 312/223.2 |
| 5,926,386 A | * | 7/1999 | Ott et al. | 700/70 |
| 5,934,774 A | * | 8/1999 | Wu et al. | 312/223.2 |
| 6,088,223 A | * | 7/2000 | Diemunsch | 361/690 |
| 6,201,702 B1 | * | 3/2001 | Schmitt | 361/725 |
| 6,288,893 B1 | * | 9/2001 | Faranda et al. | 361/683 |
| 6,597,972 B2 | * | 7/2003 | Emberty et al. | 700/304 |
| 6,601,164 B1 | * | 7/2003 | Robertson | 713/1 |
| 6,618,247 B2 | * | 9/2003 | Felcman et al. | 361/685 |
| 2003/0128509 A1 | * | 7/2003 | Oudet | 361/687 |
| 2004/0120106 A1 | * | 6/2004 | Searby et al. | 361/683 |

FOREIGN PATENT DOCUMENTS

JP    02002108508 A  *  4/2002  ........... G06F/1/20

* cited by examiner

Primary Examiner—Michael Datskovsky
(74) Attorney, Agent, or Firm—Kevin M. Hart

(57) ABSTRACT

A dual-purpose computer according to the invention has a gravity-actuated switch mounted therein or thereon. The gravity-actuated switch is used to control the speed of a cooling fan for the computer. When the computer is operated in a horizontal orientation such as a typical rack-mounted server would be, the gravity actuated switch assumes a first state. When the computer is operated in a vertical orientation such as a typical desk side workstation would be, the gravity actuated switch assumes a second state. When the switch is in the first state, fan speed controller circuitry runs the fan at a first speed. When the switch is in the second state, fan speed controller circuitry runs the fan at a second speed. In one embodiment, the first speed is a higher speed intended to optimize reliability, and the second speed is a lower speed intended to minimize noise.

17 Claims, 3 Drawing Sheets

DUAL-PURPOSE COMPUTER HAVING GRAVITY-ACTUATED FAN SPEED CONTROL

FIELD OF THE INVENTION

This invention relates generally to methods and apparatus for controlling cooling fans for electronic equipment such as computers.

BACKGROUND

It would be desirable to have the option of deploying a single computer as either a server or a workstation. One of the challenges in doing so is that workstation computers need to be quiet under normal circumstances because they are typically located near users in an office environment. Server computers on the other hand need to be as reliable as possible. Consequently, fans inside server computers are typically run at higher speeds than are those within workstation computers. The higher fan speed provides better cooling and therefore better longevity for the components inside the enclosure. But higher fan speeds create noise, and so are problematic in workstations.

SUMMARY OF THE INVENTION

A dual-purpose computer according to the invention has a gravity-actuated switch mounted therein or thereon. The gravity-actuated switch is used to control the speed of a cooling fan for the computer. When the computer is operated in a horizontal orientation such as a typical rack-mounted server would be, the gravity actuated switch assumes a first state. When the computer is operated in a vertical orientation such as a typical desk side workstation would be, the gravity actuated switch assumes a second state. When the switch is in the first state, fan speed controller circuitry runs the fan at a first speed. When the switch is in the second state, fan speed controller circuitry runs the fan at a second speed. In one embodiment, the first speed is a higher speed intended to optimize reliability, and the second speed is a lower speed intended to minimize noise.

DETAILED DESCRIPTION OF THE PREFERRED EMBODIMENTS

Figure 1:
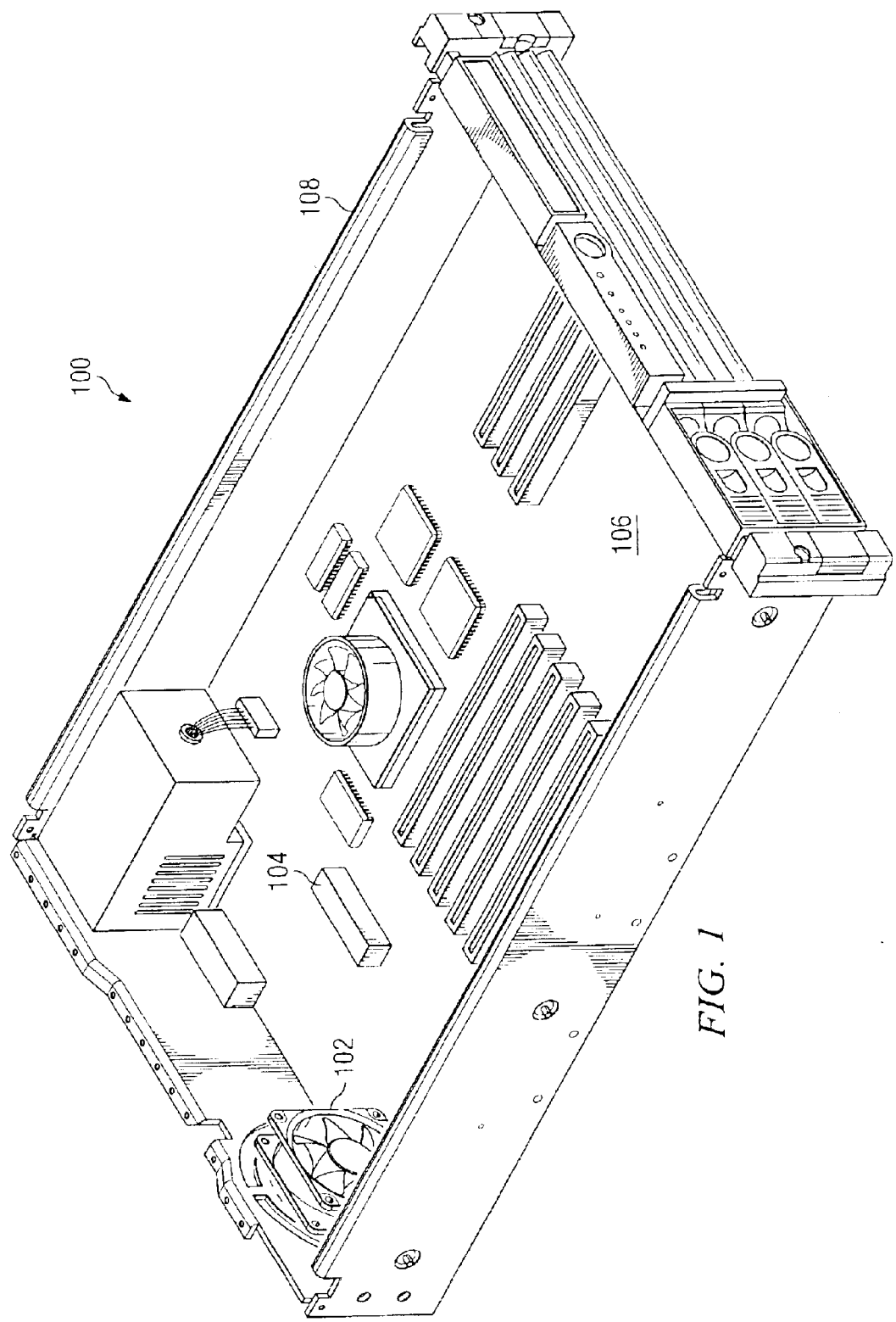
FIG. 1 is an oblique view of a computer having a gravity-actuated switch and a fan therein according to one preferred embodiment of the invention.

FIG. 1 illustrates a computer 100 having a cooling fan 102 and a gravity-actuated switch 104 according to one preferred embodiment of the invention. In the embodiment shown, gravity-actuated switch 104 is mounted to a circuit board 106 which is in turn mounted to a chassis 108. This arrangement ensures that gravity-actuated switch 104 is in fixed relationship with chassis 108 so that changing the orientation of chassis 108 will change the orientation of switch 104. Such a fixed relationship may be achieved in different ways in alternative embodiments. For example, the switch may be mounted to a daughter card, and the daughter card mounted to a motherboard. Or the switch may be mounted to the chassis. In still other embodiments, chassis 108 may be dispensed with altogether and the motherboard may be considered the computer.

Figure 2:
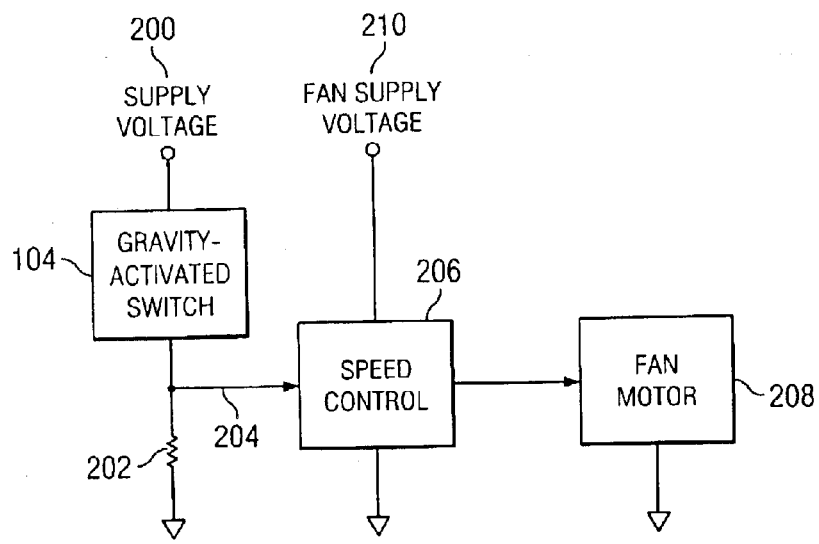
FIG. 2 is a schematic diagram illustrating fan speed controller circuitry according to one preferred embodiment of the invention.

The electrical aspects of controlling the speed of fan 102 responsive to the state of switch 104 may be accomplished in a variety of ways. One way of doing so is illustrated in FIG. 2, wherein switch 104 is connected between a supply voltage 200 and a pull-down resistor 202. When switch 104 is closed, the voltage at node 204 will be equal to supply voltage 200. When switch 104 is open, the voltage at node 204 will be equal to ground. Fan controller circuitry 206 senses the voltage on node 204 and runs fan motor 208 at a first or a second speed depending on the state of node 204. Any conventional means may be employed to accomplish the speed adjustment of the fan motor. For example, for DC motors such techniques might include adjustment of flux (such as by adjustment of field current), adjustment of armature circuit resistance, adjustment of armature terminal voltage, adjustment of duty cycle or pulse width, and the like. Thus the fan controller circuitry may be as simple as a switched voltage divider or as complex as a microprocessor-based controller. All such techniques are well known. Fan supply voltage 210 may be the same as or different from supply voltage 200.

Gravity-actuated switch 104 may also take a variety of well-known forms. For example, switch 104 may be fluid-operated. (One example of a fluid-operated gravity switch is the well-known mercury switch.) Alternatively, for example, the switch may be roller-operated or spring-operated.

Figure 4:
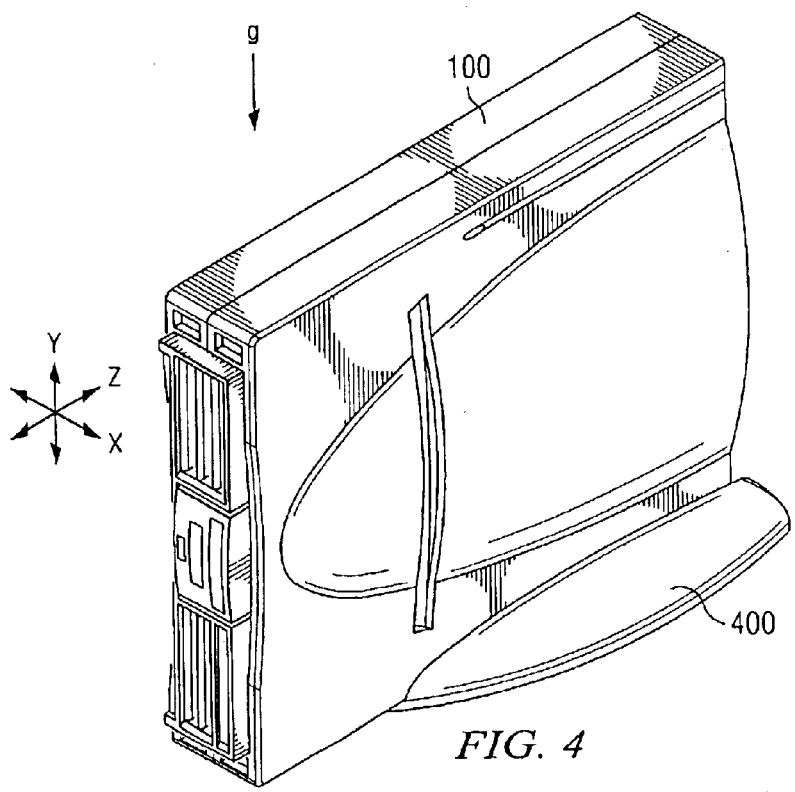
FIG. 4 is an oblique view of a desk-side computer oriented in a vertical direction.
Figure 3:
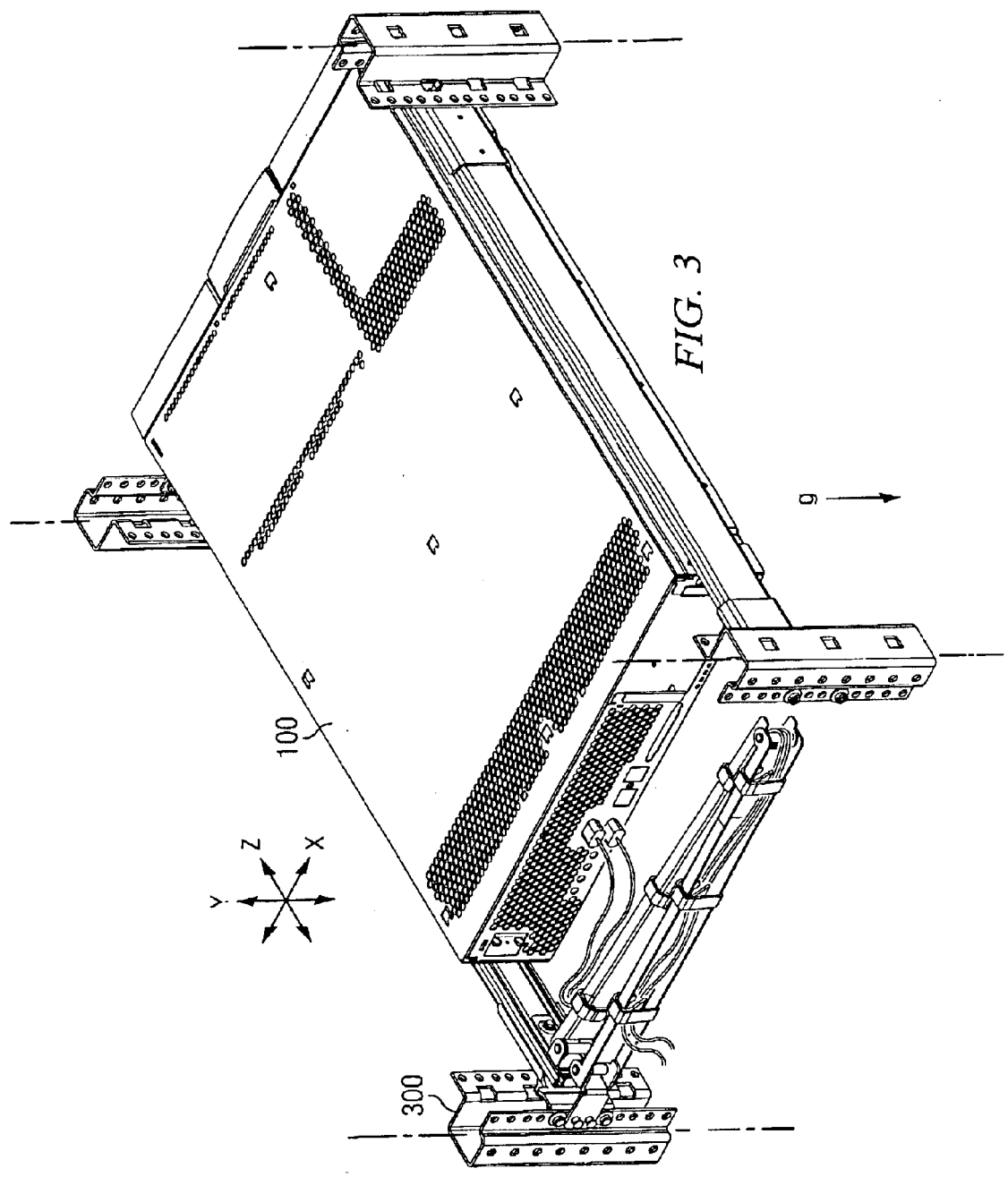
FIG. 3 is an oblique view of a rack-mounted computer oriented in a horizontal direction.

Preferred operating modes for computer 100 are illustrated in FIGS. 3-4. In FIG. 3, computer 100 is placed in a horizontal orientation wherein the force of gravity "g" is orthogonal to the plane of the computer. (Server computers are commonly mounted horizontally in a rack structure 300 as shown.) Such an orientation causes switch 104 to assume a first state. In FIG. 4, computer 100 is placed in a vertical orientation wherein the force of gravity "g" is parallel to the plane of the computer. (Desk side computers are commonly mounted vertically in a base structure 400 as shown.) Such an orientation causes switch 104 to assume a second state.

The speed of fan motor 208 may be faster when switch 104 is in the first state than when it is in the second state. This will tend to provide better cooling and thus better longevity of computer components when the computer is rack mounted. This will also create less noise when the computer is used at the desk side. In alternative embodiments, the computer may be vertical when used as a server and horizontal when used in the office environment. Moreover, the fan or fans being controlled need not be chassis fans but may be CPU heat sink fans or other fans associated with the computer. In any case, the orientation of the computer may be used to control the fan speed to achieve the desired effect using the above-described techniques.

While the invention has been described in detail in relation to a preferred embodiment thereof, the described embodiment has been presented by way of example and not by way of limitation. It will be understood by those skilled in the art that various changes may be made in the form and details of the described embodiment without deviating from the spirit and scope of the invention as defined by the appended claims.

What is claimed is:

1. A dual-purpose computer, comprising:
    a chassis;
    a gravity-actuated switch mounted in fixed relationship to the chassis and operable to assume first and second states responsive to whether the chassis is in a horizontal or a vertical orientation;
    fan controller circuitry coupled to the gravity-actuated switch; and a fan motor coupled to the fan controller circuitry;

wherein the fan controller is operable to run the fan motor at a first speed when the switch is in the first state, and at a second speed different than the first speed when the switch is in the second state.

2. The dual-purpose computer of claim 1, wherein:

the first speed is faster than the second speed.

3. The dual-purpose computer of claim 1, wherein:

the switch is mounted to a circuit board within the chassis.

4. The dual-purpose computer of claim 1, wherein:

the switch is a fluid-operated switch.

5. The dual-purpose computer of claim 4, wherein:

the fluid is mercury.

6. The dual-purpose computer of claim 1, wherein:

the switch is a roller-operated switch.

7. The dual-purpose computer of claim 1, wherein:

the switch is a spring-operated switch.

8. The dual-purpose computer of claim 1, wherein:

the fan controller circuitry functions by controlling a voltage applied to the fan motor.

9. A dual-purpose computer, comprising:

a circuit board;

a gravity-actuated switch mounted in fixed relationship to the circuit board and operable to assume first and second states responsive to whether the circuit board is in a horizontal or a vertical orientation;

fan controller circuitry coupled to the gravity-actuated switch; and a fan motor coupled to the fan controller circuitry;

wherein the fan controller is operable to run the fan motor at a first speed when the switch is in the first state, and at a second speed different than the first speed when the switch is in the second state.

10. The dual-purpose computer of claim 9, wherein:

the first speed is faster than the second speed.

11. The dual-purpose computer of claim 9, wherein:

the switch is a fluid-operated switch.

12. The dual-purpose computer of claim 11, wherein:

the fluid is mercury.

13. The dual-purpose computer of claim 9, wherein:

the switch is a roller-operated switch.

14. The dual-purpose computer of claim 9, wherein:

the switch is a spring-operated switch.

15. The dual-purpose computer of claim 9, wherein:

the fan controller circuitry functions by controlling a voltage applied to the fan motor.

16. A method of controlling the speed of a cooling fan for a computer, comprising:

to run the fan at a first speed, causing a gravity-actuated switch to assume a first state by placing the computer in a horizontal orientation; and to run the fan at a second speed, causing the gravity-actuated switch to assume a second state by placing the computer in a vertical orientation.

17. The method of claim 16, wherein:

the first speed is higher than the second speed.

* * * * *